United States Patent
Basin et al.

(10) Patent No.: US 10,998,473 B2
(45) Date of Patent: May 4, 2021

(54) PACKAGED WAVELENGTH CONVERTED LIGHT EMITTING DEVICE

(71) Applicant: Lumileds LLC, San Jose, CA (US)

(72) Inventors: Grigoriy Basin, San Francisco, CA (US); Jing Liu, Fremont, CA (US); Joseph Chungchih Juan, Fremont, CA (US); R B Syivaram Balakrishnan, Milpitas, CA (US); Thierry Maurice Francois De Smet, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/319,095

(22) PCT Filed: Jun. 23, 2015

(86) PCT No.: PCT/IB2015/054700
§ 371 (c)(1),
(2) Date: Dec. 15, 2016

(87) PCT Pub. No.: WO2015/198220
PCT Pub. Date: Dec. 30, 2015

(65) Prior Publication Data
US 2017/0133560 A1 May 11, 2017

Related U.S. Application Data

(60) Provisional application No. 62/016,708, filed on Jun. 25, 2014.

(51) Int. Cl.
*H01L 33/50* (2010.01)
*H01L 33/54* (2010.01)
(Continued)

(52) U.S. Cl.
CPC ........ *H01L 33/507* (2013.01); *H01L 25/0753* (2013.01); *H01L 33/486* (2013.01);
(Continued)

(58) Field of Classification Search
CPC ... H01L 33/507; H01L 25/0753; H01L 33/54; H01L 33/501; H01L 2933/005; H01L 2933/0041
(Continued)

(56) References Cited

U.S. PATENT DOCUMENTS 6,870,311 B2 * 3/2005 Mueller ............... H01L 33/501
257/98
7,410,305 B2 8/2008 Ohe et al.
(Continued)

FOREIGN PATENT DOCUMENTS

CN 1753170 A 3/2006
CN 101047221 A 10/2007
(Continued)

OTHER PUBLICATIONS

EPO as ISA, "International Search Report and Written Opinion" dated Sep. 9, 2015 from International Application No. PCT/IB2015/054700, filed Jun. 23, 2015, 12 pages.
(Continued)

*Primary Examiner* — Mohammad M Hoque (57) ABSTRACT

Embodiments of the invention include a plurality of light emitting devices, each light emitting device having a top surface, a bottom surface opposite the top surface, and at least one side surface connecting the top surface and the bottom surface. A wavelength converting layer is disposed in direct contact with the top surface and one side surface of each of the plurality of light emitting devices to mechanically connect each of the plurality of light emitting devices together. The wavelength converting layer is made up of a
(Continued)

wavelength converting material, an adhesive material, and a transparent material that has a thermal conductivity of at least 0.2 W/mK. The adhesive material and the transparent material have indices of refraction that vary less than ten percent.

21 Claims, 4 Drawing Sheets

(51) Int. Cl.
  *H01L 33/48* (2010.01)
  *H01L 25/075* (2006.01)
(52) U.S. Cl.
  CPC ............ *H01L 33/501* (2013.01); *H01L 33/54* (2013.01); *H01L 33/502* (2013.01); *H01L 2933/005* (2013.01); *H01L 2933/0041* (2013.01)
(58) Field of Classification Search
  USPC .......................................................... 257/88
  See application file for complete search history.

(56) References Cited

U.S. PATENT DOCUMENTS

| | | | |
|---|---|---|---|
| 7,910,940 B2 | 3/2011 | Koike et al. | |
| 8,203,161 B2 | 6/2012 | Simonian et al. | |
| 8,664,635 B2 | 3/2014 | Jung et al. | |
| 8,723,192 B2 | 5/2014 | Weidner et al. | |
| 9,490,397 B2 | 11/2016 | Preuss et al. | |
| 2003/0094695 A1 | 5/2003 | Hedler et al. | |
| 2005/0173708 A1 | 8/2005 | Suehiro et al. | |
| 2007/0215998 A1 | 9/2007 | Hu et al. | |
| 2010/0096977 A1 | 4/2010 | Lee et al. | |
| 2010/0155755 A1* | 6/2010 | Dong ................... | H01L 33/508 257/98 |
| 2010/0200874 A1* | 8/2010 | Shioi ................... | C09K 11/0883 257/91 |
| 2011/0012147 A1 | 1/2011 | Bierhuizen et al. | |
| 2011/0121331 A1* | 5/2011 | Simonian .............. | H01L 33/504 257/98 |
| 2011/0298004 A1* | 12/2011 | Matsuda ................ | H01L 33/50 257/100 |
| 2012/0007119 A1* | 1/2012 | Shiobara ................ | H01L 33/44 257/98 |
| 2013/0063020 A1* | 3/2013 | Daicho ............... | H01L 25/0753 313/502 |
| 2013/0114255 A1* | 5/2013 | Schick .................... | F21V 11/00 362/236 |
| 2013/0187178 A1* | 7/2013 | Tischler ................. | H01L 33/50 257/88 |
| 2013/0207148 A1 | 8/2013 | Krauter et al. | |
| 2013/0234184 A1 | 9/2013 | Chen et al. | |
| 2013/0264601 A1* | 10/2013 | Matsumura ............ | C09K 11/02 257/98 |
| 2014/0151734 A1 | 6/2014 | Ito et al. | |
| 2016/0056349 A1* | 2/2016 | Cui ...................... | H01L 33/508 257/98 |
| 2017/0365747 A1* | 12/2017 | Basin ................... | H01L 33/501 |

FOREIGN PATENT DOCUMENTS

| | | |
|---|---|---|
| CN | 101208811 A | 6/2008 |
| CN | 102714261 A | 10/2012 |
| CN | 102893078 A | 1/2013 |
| CN | 103003966 A | 3/2013 |
| CN | 103650179 A | 3/2014 |
| DE | 102009018087 A1 | 12/2009 |
| DE | 102012113003 A1 | 4/2014 |
| EP | 2388838 A1 | 11/2011 |
| EP | 2462633 A1 | 6/2012 |
| JP | 2007243056 A * | 9/2007 |
| JP | 2013162130 A | 8/2013 |
| JP | 2014045194 A | 3/2014 |
| TW | 201115790 A | 5/2011 |
| WO | 2011015449 A1 | 2/2011 |
| WO | 2013/011628 A1 | 1/2013 |

OTHER PUBLICATIONS

English Translation of Office Action of Japan Office Action, Patent Application No. 2016-575094, dated May 7, 2019, 5 pages.

* cited by examiner

PACKAGED WAVELENGTH CONVERTED LIGHT EMITTING DEVICE

CROSS-REFERENCE TO RELATED APPLICATIONS

The present application is a § 371 application of International Application No. PCT/IB2015/054700 filed on Jun. 23, 2015 and entitled "PACKAGED WAVELENGTH CONVERTED LIGHT EMITTING DEVICE," which claims the benefit of U.S. Provisional Application No. 62/016,708 filed Jun. 25, 2014. International Application No. PCT/IB2015/054700 and U.S. Provisional Application No. 62/016,708 are incorporated herein.

FIELD OF THE INVENTION

The present invention relates to a packaged wavelength converted semiconductor light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Figure 1:
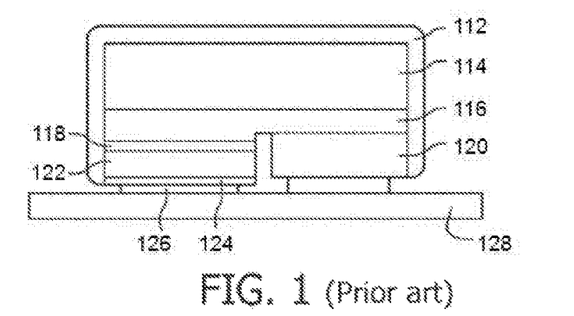
FIG. 1 illustrates a prior art device including an LED attached to a submount and covered with a phosphor.

FIG. 1 illustrates an LED coated with a luminescent material 112, such as a phosphor, which absorbs light of one wavelength and emits light of a different wavelength. The LED includes an n-type region 116 formed on a substrate 114, such as sapphire, SiC, or a III-nitride material. An active region 118 is formed on the n-type region 116, and a p-type region 122 is formed on the active region 118. A portion of the p-type region 122, the active region 118, and the n-type region 116 is etched away to expose a portion of n-type region 116. A p-type contact 124 is deposited on the p-type region 122 and an n-type contact 120 is deposited on the exposed portion of n-type region 116. The LED is flipped over and mounted to a submount 128 by a material 126 such as solder.

SUMMARY

It is an object of the invention to provide a packaged semiconductor light emitting device such as an LED, which does not require the LED to be attached to a mount.

Embodiments of the invention include a plurality of light emitting devices, one of the light emitting devices in the plurality being configured to emit light having a first peak wavelength. A wavelength converting layer is disposed in a path of light emitted by the plurality of light emitting devices. The wavelength converting layer absorbs light emitted by the light emitting device and emits light having a second peak wavelength. The plurality of light emitting devices are mechanically connected to each other only through the wavelength converting layer.

Embodiments of the invention include a light emitting device for emitting light having a first peak wavelength. A wavelength converting layer is disposed over the light emitting device. An optical element layer is disposed over the wavelength converting layer. The optical element layer covers a top surface and every side surface of the light emitting device.

DETAILED DESCRIPTION

In the device illustrated in FIG. 1, the submount 128 remains part of the finished device. Such a device may be inconvenient, for example in applications requiring a particular platform that is incompatible with the submount 128, or in applications requiring multiple LEDs with individual optical elements placed in close proximity to each other.

In embodiments of the invention, an LED is packaged without first attaching the LED to a mount. The packaged LED includes the LED and a wavelength converting layer. In some embodiments, for example where the LED is a high power device, the wavelength converting layer is formed over the LEDs, then an optical element is formed over the wavelength converting layer by any suitable technique including, for example, molding, lamination, spaying, or screen printing. In some embodiments, for example where the LED is a lower power device, wavelength converting material is mixed with the optical element and disposed over the LEDs by any technique including, for example, molding, lamination, spaying, or screen printing.

A wafer of packaged LEDs may be separated into individual packaged LEDs, or arrays of packaged LEDs connected only through the wavelength converting layer and/or optical element material.

Though in the examples below the semiconductor light emitting device are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
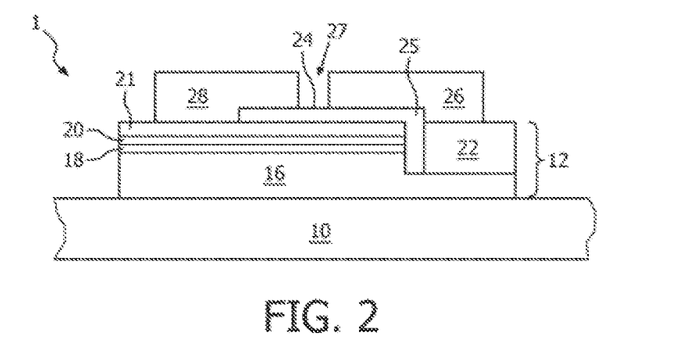
FIG. 2 illustrates one example of a III-nitride LED.

FIG. 2 illustrates a III-nitride LED that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure 12 on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED, one or more interconnects 26 and 28 are formed on or electrically connected to the n- and p-contacts 22 and 21. Interconnect 26 is electrically connected to n-contact 22 in FIG. 2. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. Many individual LEDs are formed on a single wafer then diced from a wafer of devices, into single LEDs or groups or arrays of LEDs. The semiconductor structure and the n- and p-contacts 22 and 21 are represented in the following figures by block 12.

Figure 3:
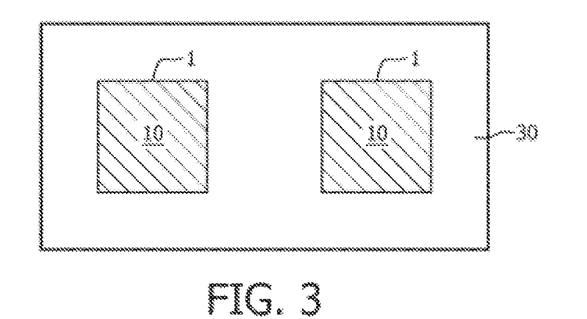
FIG. 3 is a top view of LEDs with a wavelength converting layer according to embodiments of the invention.
Figure 4:
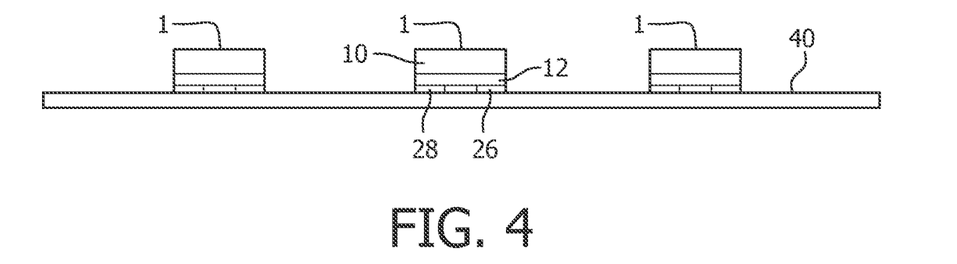
FIG. 4 illustrates LEDs attached to a portion of tape disposed on a substrate.
Figure 5:
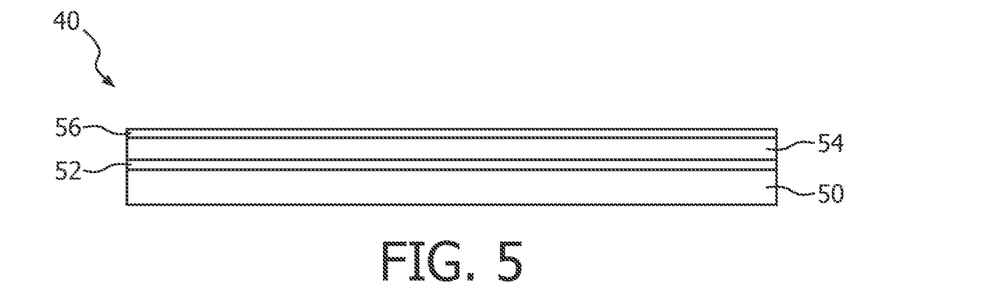
FIG. 5 is a cross sectional view of tape disposed on a substrate.

FIG. 3 is a top view of an array of packaged LEDs including two LEDs and a wavelength converting layer. In FIG. 3, the area of the top surface of each of the LEDs 10 is represented by the hatched areas, though the top surfaces of the LEDs 10 are covered by wavelength converting layer 30. FIGS. 4, 5, 6, and 7 illustrate how to form the device illustrated in FIG. 3. In the device illustrated in FIG. 3, each LED die 1 is surrounded on five sides by the wavelength converting layer 30. Wavelength converting layer 30 covers the top and all sides of LEDs 1. The only surface of LEDs 1 not covered by the wavelength converting layer 30 is the bottom surface, i.e. the surface including any suitable structure used to make electrical connection to the LEDs, typically interconnects as illustrated in FIG. 2 or metal contacts. The interconnects allow a user attaching the structure to another structure such as a PC board. (LED 1 as illustrated in FIGS. 3, 4, and 5 is rectangular, so it has four side surfaces and the top surface of the substrate covered by wavelength converting layer 30. LEDs of other shapes are within the scope of the invention—wavelength converting layer 30 in some embodiments would cover the top surface and all side surfaces of an LED of arbitrary shape.) For a single LED, the structure including the LED and the wavelength converting layer 30 may have a cubic, hyperrectangle, rectangular parallelepiped, parallelepiped, or any other suitable shape.

Though a linear array of two LEDs is illustrated, any suitable arrangement of LEDs and any number of LEDs may be used such as, for example, single LEDs, linear arrays longer than two LEDs, two by two or three by three square arrays, rectangular arrays, or any other suitable arrangement. Since the LEDs are not disposed on a structure such as a mount, the two LEDs illustrated in FIG. 3 are mechanically connected to each other only through the wavelength converting layer 30. The LEDs are therefore connected via the wavelength converting layer 30 only through their top surfaces and their side surfaces, and not through their bottom surfaces. In contrast, when LEDs are disposed on a mount, they are typically connected via the mount through their bottom surfaces.

The wavelength converting layer 30 may include a wavelength converting material, a transparent material, and an adhesive material. The wavelength converting layer 30 may have high thermal conductivity. In addition, since the wavelength converting layer material is formed over the device for example by molding, lamination, or any other suitable technique, the particle content of the wavelength converting layer (i.e. the wavelength converting material and the transparent material) can be significant; for example, up to 90% of the wavelength converting layer by weight in some embodiments. Though the examples below refer to molding the wavelength converting layer, adhesive materials besides molding compound and techniques besides molding may be used to form the wavelength converting layer and are within the scope of embodiments of the invention. For example, in embodiments of the invention, the wavelength converting layer includes wavelength converting material, transparent material, and a sol-gel adhesive material. Such a wavelength converting layer may be formed by dispensing the wavelength converting layer in liquid form then curing the sol gel material.

One example of a prior art packaged LED includes a vertical LED with a wirebond that attaches the LED to a molded leadframe cup. After forming the wirebond, the cup is filled with a silicone/phosphor slurry. This architecture may be referred to as "goop in cup". The goop in cup architecture is low cost and easy to manufacture. However, the goop in cup architecture is limited in reliably handling high input power densities due to the high thermal resistance (as high as ~20 C/W) of the LED die, the wirebond, and the phosphor/silicone material (the "goop"). Flip chip type LEDs may also be disposed in the goop in cup architecture. An advantage of a flip chip is that the thermal resistance of the LED and typical flip chip interconnects is relatively low (typically <5 C/W). However, the thermal resistance of the phosphor/silicone material is still high and as a result the device cannot reliably handle high power densities.

In the structure illustrated in FIG. 3, because wavelength converting layer 30 is formed over LED 1 by a technique (other than dispensing over the LED, as in the goop in cup architecture described above) that permits wavelength converting layer 30 to have a high particle content as compared to a phosphor/silicone material used in goop in cup devices. Accordingly, wavelength converting layer 30 may have a high content of particles with high thermal conductivity, which may improve the thermal conductivity of wavelength converting layer 30 and therefore the thermal conductivity of the structure.

The wavelength converting material may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure, e.g. a yellow emitting material may be augmented with red emitting material.

The transparent material may be, for example, a powder, particles, or other material with a high thermal conductivity; for example, with a higher thermal conductivity that either the wavelength converting material or the adhesive material. In some embodiments, the transparent material has a higher thermal conductivity than common silicone materials, which may have a thermal conductivity around 0.1-0.2 W/mK. In some embodiments, the transparent material is substantially index matched to the adhesive material. For example, the indices of refraction of the transparent material and the adhesive material may vary less than 10% in some embodiments. In some embodiments, the index of refraction of the transparent material is at least 1.5. Examples of suitable transparent materials include crystobalite, glass particles, or beads.

The adhesive material may be any material robust enough to connect multiple LEDs together, in embodiments where multiple LEDs are connected through the wavelength converting layer 30. The adhesive material binds together the transparent material and the wavelength converting material. The adhesive material may be selected to have an index of refraction of at least 1.5 in some embodiments. In some embodiments, the adhesive material is a moldable, thermoset material. Examples of suitable materials include silicone, epoxy, and glass. The adhesive material and the transparent material are typically different materials, or the same material in different forms, though they need not be. For example, the transparent material may be glass particles, while the adhesive material may be molded glass. In some embodiments, the adhesive material is a sol gel material. In embodiments where the adhesive material is a sol gel, a mixture of wavelength converting material, transparent material, and sol gel liquid may be dispensed over the LEDs 1, then water is evaporated from the sol gel liquid, leaving a silicate network that is essentially a glass with wavelength converting material and transparent material embedded in the silicate network.

In some embodiments, the wavelength converting layer 30 is mostly transparent material, with relatively less wavelength converting material and adhesive material. The wavelength converting layer 30 may be by weight at least 50% transparent material in some embodiments, 60% transparent material in some embodiments, and no more than 70% transparent material in some embodiments. The wavelength converting layer 30 may be by weight at least 20% wavelength converting material in some embodiments, 30% wavelength converting material in some embodiments, and no more than 40% wavelength converting material in some embodiments. The wavelength converting layer 30 may be by weight at least 5% adhesive material in some embodiments, 10% adhesive material in some embodiments, and no more than 20% adhesive material in some embodiments.

The thermal conductivity of the wavelength converting layer 30 may be at least 0.5 W/mK in some embodiments and at least 1 W/mK in some embodiments. In contrast, the goop in a goop in cup architecture typically has a thermal conductivity of no more than 0.1 W/mK.

The structure illustrated in FIG. 3 may be formed according to the method illustrated in FIGS. 4, 5, 6, and 7. After the LEDs are formed and separated from a wafer of LEDs, they are "binned", meaning LEDs with similar peak emission wavelengths are grouped according to the characteristics of the wavelength converting material necessary for the wavelength converted LED to meet a specification for a given application.

In FIG. 4, individual LEDs from a single bin are disposed on a substrate 40 by any suitable technique such as, for example, a conventional pick and place process. Though single LEDs are illustrated in FIG. 4, LEDs 1 may be diced from a wafer into groups rather than as single LEDs. LEDs that will eventually be separated from the wafer as individual devices may be spaced, for example, at least 100 µm apart in some embodiments, at least 200 µm apart in some embodiments, no more than 500 µm apart in some embodiments, and no more than 400 µm apart in some embodiments, depending, for example, on the application method of the wavelength converting material or on other factors. LEDs that will eventually be separated from the wafer in an array may be spaced, for example, at least 100 µm from other LEDs in the array in some embodiments, at least 200 µm from other LEDs in the array in some embodiments, no more than 500 µm from other LEDs in the array in some embodiments, and no more than 400 µm from other LEDs in the array in some embodiments.

Substrate 40 is a temporary handling substrate. Any suitable material may be used, such as carrier tape with an adhesive layer. FIG. 5 is a cross section of one example of a substrate 40. The substrate 40 includes a carrier 50, and a double sided sticky tape including an adhesive layer 52, a tape layer 54, and a release layer 56.

The carrier 50 may be a structure that provides mechanical support and stability to the LEDs during mounting on the substrate and during later processing. Suitable materials include, for example, glass, ceramic, or plastic.

The adhesive layer 52, tape layer 54, and release layer 56 form a double sided sticky tape that is attached to the carrier. After processing, the double sided sticky tape may be removed from the carrier 50, such that the carrier may be reused. Also, the double-sided-sticky-tape-on carrier configuration allows the wavelength converting layer 30 and optical element layer 70, described below, to be formed in a conventional molding machine. The tape layer 54 separates the two sticky layers and may be any suitable structure including, for example, wafer handling tape. The adhesive layer 52 attaches tape layer 54 to carrier 50. Any suitable material may be used including, for example, acrylic and silicone. The LEDs attach to release layer 56. Accordingly, release layer 56 is selected to securely hold the LEDs in place during processing, then to release the LEDs and associated structures after processing. Examples of suitable materials include thermal release adhesive, which acts like an adhesive at room temperature, but can be removed by heating to a temperature above room temperature.

Figure 6:
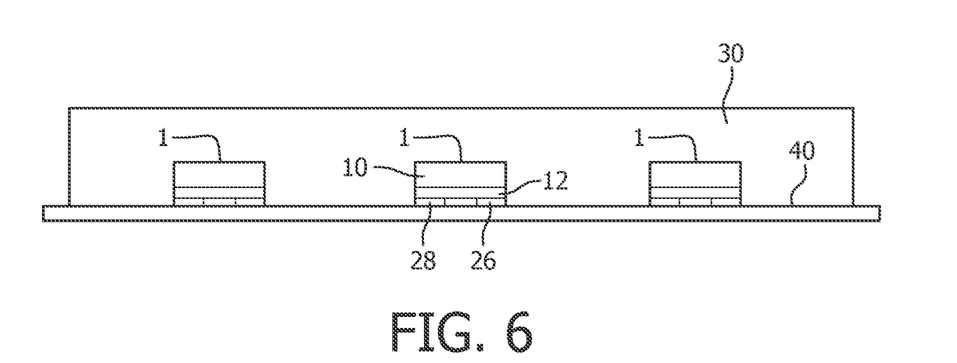
FIG. 6 illustrates the structure of FIG. 4 after forming a wavelength converting layer over the LEDs.

In FIG. 6, wavelength converting layer 30, as described above, is molded over LEDs 1. For example, a mold (not shown in FIG. 6) may be disposed over a group of LEDs 1, then filled with molding material (i.e. the material that will form the wavelength converting layer). Wavelength converting layer 30 may include a thermoset adhesive material in liquid form. The structure is treated, for example by heating, to transform the thermoset adhesive material into a solid. The mold is then removed. The wavelength converting layer 30 is disposed over the tops of LEDs 1 and between neighboring LEDs 1. The release layer 56 and molding material are selected such that the release layer 56 adheres well to the metal on the bottom surface of the LEDs, but adheres relatively weakly to the molding material. After molding, the LEDs may be easily removed from the release layer.

Figure 7:
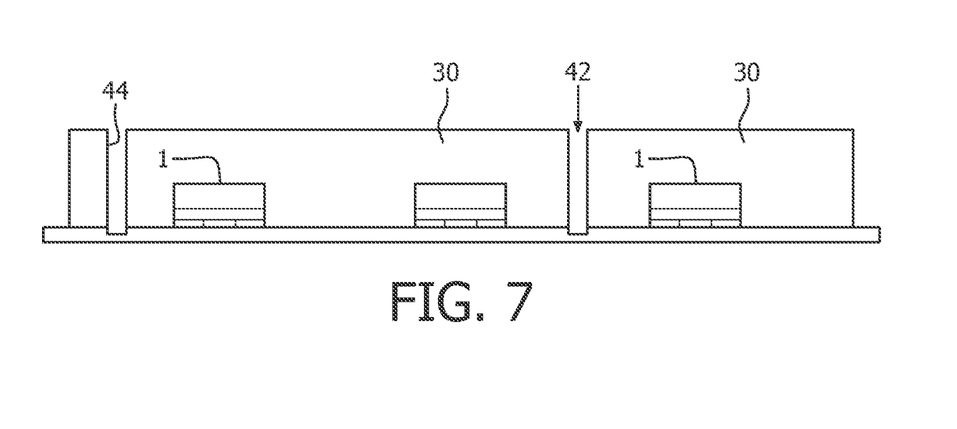
FIG. 7 illustrates the structure of FIG. 6 after separating the LEDs.

In FIG. 7, individual LEDs or groups of LEDs are separated, for example by cutting the wavelength converting layer 30 between neighboring LEDs in streets 42 at the desired locations. Any suitable cutting technique may be used, such as diamond sawing or laser cutting. Preferably the cutting technique should not cut through the substrate 40. The cutting illustrated in FIG. 7 may result in substantially vertical sidewalls 44 in some embodiments, as illustrated. In some embodiments, the sidewalls 44 are angled or otherwise shaped, for example to enhance light extraction from wavelength converting layer 30. The separation step may leave vertical sidewalls which are angled in a second step. In the alternative a wider street may be used together with a different cutting blade e.g. a cone shaped blade to produce angled sides in one step.

The separated LEDs or arrays of LEDs are released from substrate 40 by any suitable method including, for example, thermal release, transfer to a second substrate, or direct picking. The LEDs may be tested, and are otherwise ready to be mounted by a user to a structure such as a PC board. The LEDs are mounted on another structure for example by soldering or any other suitable mounting technique through interconnects 28 and 26 on the bottoms of LEDs 1.

Figure 8:
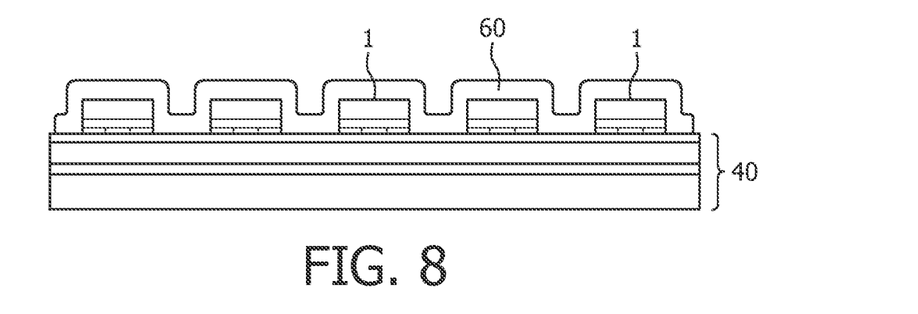
FIG. 8 illustrates a wavelength converting layer conformally applied over LEDs disposed on a substrate.
Figure 9:
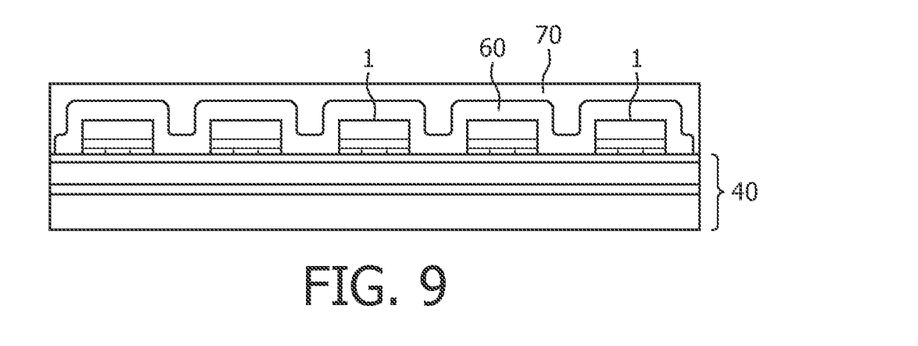
FIG. 9 illustrates the structure of FIG. 8 after forming an optical element over the LEDs.
Figure 10:
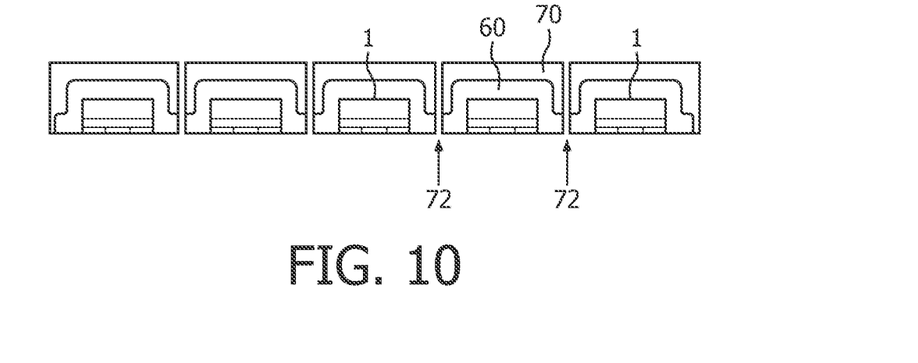
FIG. 10 illustrates the structure of FIG. 9 after removing the LEDs from the substrate and separating the LEDs into single LEDs or groups of LEDs.
Figure 11:
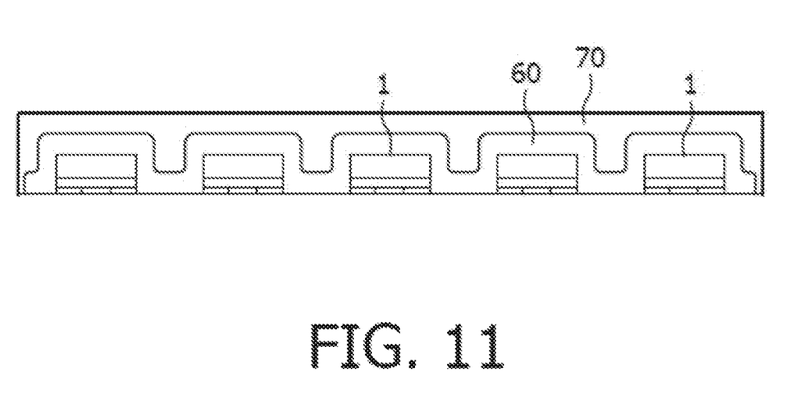
FIG. 11 illustrates the structure of FIG. 9 after removing the LEDs from the substrate and before separating the LEDs into single LEDs or smaller groups of LEDs.

FIGS. 8, 9, and 10 illustrate forming alternative embodiments of a packaged LED or array of LEDs. After the LEDs 1 are disposed on the substrate 40, as illustrated in FIG. 4 and described above, a wavelength converting layer 60 is disposed over the LEDs, as shown in FIG. 8. The thickness of wavelength converting layer 60 over the tops of LEDs 1 may be fairly thin; for example, no thicker than 500 µm in some embodiments, no thicker than 100 µm in some embodiments, no thicker than 50 µm in some embodiments, and at least 10 µm thick in some embodiments. Wavelength converting layer 60 may include at least one wavelength converting material, which may be any of the materials described above in the discussion of FIG. 3. The wavelength converting material may be disposed in a transparent binder material such as silicone or any other suitable material.

The wavelength converting layer 60 may be formed separately from the LEDs. In one embodiment, to create a wavelength converting layer, one or more phosphor powders are mixed with silicone to achieve a target phosphor density, and the wavelength converting layer is formed to have a target thickness. The desired thickness may be obtained by any suitable technique including, for example, spinning the mixture on a flat surface, molding the wavelength converting layer, lamination. The wavelength converting layer is flexible in some embodiments.

To form the structure shown in FIG. 8, the wavelength converting layer 60 may be placed over the LEDs 1, and a vacuum may be drawn between the wavelength converting layer 60 and the LEDs 1 to remove substantially all air. The wavelength converting layer 60 can then be laminated to the LEDs 1 using heat and pressure, which conforms the wavelength converting layer 60 to the top surface of the LEDs 1. A transparent material such as silicone in the wavelength converting layer 60 may be cured by heat or UV. Though the above description refers to laminating a pre-formed wavelength converting layer over the LEDs, the invention is not limited to laminating and any suitable technique and any suitable wavelength converting layer may be used.

In FIG. 9, an optical element layer 70 is disposed over the wavelength converting layer. The optical element layer 70 may be, for example, a transparent material that may act like a lens. Though the top surface of the optical element layer 70 is flat in FIG. 9, in some embodiments, the optical element layer may be shaped, for example into a hemispherical or other suitably shaped lens. The optical element layer 70 covers the top surface and at least part of every side surface of each LED.

The optical element layer may include an adhesive material, and an optional transparent material. The transparent material may be, for example, a powder, particles, or other material with a thermal conductivity higher than the adhesive. In some embodiments, the transparent material has a higher thermal conductivity than common silicone materials, which may have a thermal conductivity around 0.1-0.2 W/mK. In some embodiments, the transparent material is substantially index matched to the adhesive material. For example, the indices of refraction of the transparent material and the adhesive material may vary less than 10% in some embodiments. In some embodiments, the index of refraction of the transparent material is at least 1.5. Examples of suitable transparent materials include crystobalite, glass particles, or beads.

The adhesive material may be any material that is robust enough to connect multiple LEDs together, in embodiments where multiple LEDs are connected by the optical element layer. The adhesive material also binds together the transparent material together, in embodiments including a transparent material. The adhesive material may be selected to have an index of refraction of at least 1.5 in some embodiments. In some embodiments, the adhesive material is a moldable, thermoset material. Examples of suitable materials include silicone, epoxy, and glass. The adhesive material and the transparent material are typically different materials, or the same material in different forms, though they need not be. For example, the transparent material may be glass particles, while the adhesive material may be molded glass. In some embodiments, the adhesive material is a sol gel material. In embodiments where the adhesive material is a sol gel, a mixture of transparent material and sol gel liquid may be dispensed over the LEDs 1, then water is evaporated from the sol gel liquid, leaving a silicate network that is essentially a glass with transparent material embedded in the silicate network.

In some embodiments, the optical element layer is mostly transparent material, with relatively less adhesive material. The optical element layer may be by weight at least 50% transparent material in some embodiments, 60% transparent material in some embodiments, and no more than 70% transparent material in some embodiments.

The thermal conductivity of the optical element layer 70 may be at least 0.5 W/mK in some embodiments and at least 1 W/mK in some embodiments.

In FIG. 10, the LEDs are removed from the substrate, and separated into individual LEDs or groups or arrays of LEDs, as described above in reference to FIG. 3.

In some embodiments, the LEDs illustrated in FIGS. 3, 6, and 7, where the wavelength converting material is mixed with an adhesive material and molded over the LEDs, are mid power devices, which are low enough power that heat from the LEDs can be dissipated by the wavelength converting material 30. For example, mid power devices may be operated at less than 0.5 A or at 0.2 A, and may emit light at a flux of 50 lumens or less.

In some embodiments, the LEDs illustrated in FIGS. 8, 9, and 10, where a thin wavelength converting layer is formed over the LEDs, then an optical element layer is formed over the wavelength converting layer, are high power devices. For example, high power devices may be operated at greater than 0.8 A or at 1 A, and may emit light at a flux of 200 lumens or more. With some high power devices, a molded wavelength converting material layer 30, as illustrated in FIGS. 3, 6, and 7, may not be sufficiently thermally conductive to dissipate heat from the LEDs. Accordingly, thermally conductive wavelength material such as phosphor is disposed in a thin wavelength converting layer 60 that is placed between the LEDs and the molded optical element layer 70. The thermally conductive phosphor particles in the thin wavelength converting layer facilitate the dissipation of heat into thermally conductive structures on the LED die, which may improve the thermal performance of the device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A structure comprising:
 a plurality of light emitting devices, each of the plurality of light emitting devices having a first surface, a second surface opposite the first surface and not attached to any substrate, and at least one side surface connecting the first surface and the second surface;
 a thin wavelength converting layer disposed in direct contact with and conforming to the first surface and at least part of the at least one side surface of each of the plurality of light emitting devices, so that the thin wavelength converting layer comprises a plurality of flat regions respectively disposed over the first surface of each of the plurality of light emitting devices and a plurality of flat side regions perpendicular to the plurality of flat regions, the thin wavelength converting layer comprising depressions formed in spaces between adjacent ones of the plurality of light emitting devices; and
 an optical element layer disposed in direct contact with the thin wavelength converting layer;
 the plurality of light emitting devices being mechanically connected to each other only through the thin wavelength converting layer and the optical element layer.

2. The structure of claim 1, wherein the thin wavelength converting layer comprises a mixture of a wavelength converting material, an adhesive material, and a transparent material.

3. The structure of claim 1, wherein the thin wavelength converting layer has rounded corners.

4. The structure of claim 1, wherein a horizontal thickness of the thin wavelength converting layer measured from the at least one surface of each of the plurality of light emitting devices to respective surfaces of the plurality of flat regions is 100 μm or less.

5. The structure of claim 2, wherein the adhesive material and the transparent material having indices of refraction that differ by less than ten percent.

6. The structure of claim 2, wherein the transparent material makes up at least fifty percent, and less than 100%, of the weight of the thin wavelength converting layer.

7. The structure of claim 2, wherein the adhesive material makes up greater than 0% and no more than 15% of the weight of the thin wavelength converting layer.

8. The structure of claim 2, wherein:
 the adhesive material and the transparent material having indices of refraction that differ by less than ten percent; and
 the transparent material makes up at least fifty percent, and less than 100%, of the weight of the thin wavelength converting layer.

9. The structure of claim 1, wherein the light emitting devices are configured to be operated from greater than 0.8 A to 1 A.

10. The structure of claim 1, wherein the optical element layer comprises a mixture of an adhesive material and a transparent material.

11. The structure of claim 1, wherein the plurality of flat side regions do not directly contact any of the plurality of light emitting devices.

12. The structure of claim 10, wherein the thin wavelength converting layer has a flat connecting surface extending from one of the plurality of light emitting devices to an adjacent one of the plurality of light emitting devices.

13. The structure of claim 10, wherein the adhesive material and the transparent material having indices of refraction that differ by less than ten percent.

14. The structure of claim 10, wherein the transparent material makes up at least fifty percent, and less than 100%, of the weight of the thin wavelength converting layer.

15. The structure of claim 10, wherein the adhesive material makes up greater than 0% and no more than 15% of the weight of the thin wavelength converting layer.

16. The structure of claim 10, wherein:
- the adhesive material and the transparent material having indices of refraction that differ by less than ten percent; and
- the transparent material makes up at least fifty percent, and less than 100%, of the weight of the thin wavelength converting layer;
- the adhesive material makes up greater than 0% and no more than 15% of the weight of the thin wavelength converting layer.

17. The structure of claim 1, wherein a vertical thickness of the thin wavelength converting layer in the spaces between adjacent ones of the thin wavelength converting layer is 100 µm or less.

18. The structure of claim 1, wherein the thin wavelength converting layer has a thickness greater than 0 µm and less than 100 µm.

19. The structure of claim 1, wherein the optical element layer fills the depressions in the thin wavelength converting layer.

20. The structure of claim 1, wherein the thin wavelength converting layer is disposed on all surfaces of each light emitting device other than the second surface.

21. The structure of claim 1, wherein the plurality of light emitting devices are not mechanically connected to each other through their second surfaces.

* * * * *